United States Patent
Da Dalt

(10) Patent No.: US 7,358,820 B2
(45) Date of Patent: Apr. 15, 2008

(54) METHOD AND DEVICE FOR STABILIZING A TRANSFER FUNCTION OF A DIGITAL PHASE LOCKED LOOP

(75) Inventor: Nicola Da Dalt, Villach (AT)

(73) Assignee: Infineon Technologies AG, Munich (DE)

( * ) Notice: Subject to any disclaimer, the term of this patent is extended or adjusted under 35 U.S.C. 154(b) by 93 days.

(21) Appl. No.: 11/477,578

(22) Filed: Jun. 29, 2006

(65) Prior Publication Data

US 2007/0001772 A1 Jan. 4, 2007

(30) Foreign Application Priority Data

Jun. 30, 2005 (DE) .................. 10 2005 030 949

(51) Int. Cl.
  *H03L 7/00* (2006.01)
(52) U.S. Cl. ................. 331/16; 331/1 A; 331/34; 331/177 R; 375/376
(58) Field of Classification Search ............. 375/376; 331/16, 1 A, 34, 177 R
  See application file for complete search history.

(56) References Cited

U.S. PATENT DOCUMENTS

2007/0189431 A1* 8/2007 Waheed et al. ............ 375/376

FOREIGN PATENT DOCUMENTS

EP 1443653 8/2004

OTHER PUBLICATIONS

Staszewski, R. et al., "Just-in Time Gain Estimation of an RF Digitally Controlled Oscillator for Digital Direct Frequency Modulation," *IEEE Transact. on Circuits and Systems-II*, vol. 50, No. 11, pp. 887-892, Nov. 2003.
German Office Action dated Jan. 17, 2006.

* cited by examiner

*Primary Examiner*—Arnold Kinkead
(74) *Attorney, Agent, or Firm*—Jenkins, Wilson, Taylor & Hunt, P.A.

(57) ABSTRACT

In a method for stabilizing a transfer function of a digital phase locked loop a random digital signal is fed into the phase locked loop. The phase locked loop comprises the transfer function and a phase locked loop gain which changes with time due to disturbances and the random digital signal comprises a predetermined variance. The transfer function depends from the phase locked loop gain. A cross correlation function is generated by cross correlating a signal of the phase locked loop with the random signal and an impulse response is estimated between the random signal and the signal of the phase locked loop by means of the cross correlation function and the predetermined variance of the random signal. The transfer function of the phase locked loop is set in dependence on the estimated impulse response.

15 Claims, 3 Drawing Sheets

METHOD AND DEVICE FOR STABILIZING A TRANSFER FUNCTION OF A DIGITAL PHASE LOCKED LOOP

BACKGROUND OF THE INVENTION

The invention relates to a method and to a device for stabilizing a transfer function of a digital phase locked loop.

FIG. 1 shows a schematic block diagram of a digital phase locked loop PLL internally known to the applicant. The digital phase locked loop PLL has a phase detector BPD, a loop filter LF, a digitally controlled oscillator device DCO and a divider device TV.

The binary phase detector (BPD) determines a digital binary phase difference signal ε between a feedback clock signal fc and a reference clock signal rc. The binary phase detector provides the digital phase difference signal ε at the input of the loop filter LF. The loop filter LF generates in dependence on the digital phase difference signal ε provided an oscillator control signal ω by means of which the digitally controlled oscillator device (DCO) can be controlled. To generate the oscillator control signal ω, the loop filter LF has a first loop filter path LFP1 and a second loop filter path LFP2. The first loop filter path LFP1 is constructed as a proportional path for amplifying the digital phase difference signal ε provided. To provide higher gains, the second loop filter path LFP2 is constructed as an integral path.

The first loop filter path LFP1 has a first amplifying unit VE1 and a first timing element ZG1. The first amplifying unit VE1 receives at its input the digital phase difference signal ε and amplifies it by the gain factor β. The phase difference signal ε amplified by the gain factor β is supplied to the first timing element ZG1 which models latency times based on the hardware and delays the amplified phase difference signal ε.

The second loop filter path LFP2 has an integrator unit IE, a second amplifying unit VE2 and a second timing element ZG2. The integrator unit IE has a first addition device AV1 which adds the digital phase difference signal ε and an integrated phase difference signal ψ fed back via a third timing element ZG3. The integrated phase difference signal ψ is amplified by a gain factor α of the second loop filter path LFP2 by means of the second amplifying unit VE2. The second timing element ZG2, like the first timing element ZG1, models latency times based on the hardware and delays the integrated phase difference signal ψ.

In addition, the digital phase locked loop PLL has a second addition device AV2 which adds the output signals of the first loop filter path LFP1 and of the second loop filter path LFP2 for forming the oscillator control signal ω.

The oscillator device DCO can be controlled by means of the oscillator control signal ω and outputs a digital output clock signal dco in dependence on the oscillator control signal ω received.

The digital phase locked loop PLL also has a feedback branch between the oscillator device DCO and the phase detector BPD. In the feedback branch, a divider device TV is provided which divides the output clock signal dco of the oscillator device DCO by means of a divider factor N and provides the feedback clock signal fc at the output end. The feedback clock signal fc has an N-fold frequency of the output clock signal dco, where N is the divider factor of the divider device TV. The feedback clock signal fc is also used for clocking the loop filter LF.

FIG. 2 shows a diagrammatic representation of a linear model of the digital phase locked loop PLL according to FIG. 1. The phase detector BPD is identified by a linearized gain $K_{bpd}$ and the oscillator device (DCO) is characterized by the constant gain $K_T$. From "Jitter Transfer Analysis of Tracked Oversampling Techniques for Multigigabit Clock and Data Recovery," IEEE Trans. on Circ. Syst. Part II, vol. 50, November 2003, Y. Choi, D. K. Joeng and W. Kim, it is known that the value of the gain $K_{bpd}$ of the phase detector BPD is dependent on the fluctuation or jitter $\sigma_{tr}$ of the reference clock signal rc. This results in the following relationship between the gain $K_{bpd}$ and the jitter $\sigma_{tr}$:

$$K_{bpd}=2/(\sqrt{2\pi}\sigma_{tr}) \quad (1)$$

Due to the dependence of the transfer function of the phase locked loop PLL according to FIG. 2 on the gain $K_{bpd}$ of the phase detector BPD, the transfer function itself is also dependent on the jitter $\sigma_{tr}$. The system characteristics such as bandwidth or signal/noise ratio of the phase locked loop thus change in dependence on the reference clock signal rc.

Since the statistical characteristics of the reference clock signal rc are unknown a priori, the disturbances caused by the jitter $\sigma_{tr}$ can also not be eliminated a priori.

Some methods and circuits have hitherto become known which attempt to solve the problem of the jitter of the reference clock signal. For example, in "Jitter Transfer Analysis of Tracked Oversampling Techniques for Multigigabit Clock and Data Recovery," IEEE Trans. on Circ. Syst. Part II, vol. 50, November 2003, Y. Choi, D. K. Jeong and W. Kim, a circuit is described in which the number of quantization stages in the phase detector BPD is increased. This method can be used when the jitter is sufficiently large. However, if the jitter values are small, this method is reduced to a conventional one-bit phase detector so that the problem as such can no longer be solved at all. However, the setting-up of a number of quantization stages also means a much higher and thus more expensive hardware complexity. In addition, more energy and more chip area is needed by using the multiplicity of quantization stages.

From "A 2.5-10 Gb/s CMOS transceiver with alternating edge sampling phase detector for loop characteristic stabilization," in ISSCC Dig. Tech. Papers, 2003, B. J. Lee, M. S. Hwang, S. Lee and D. K. Jeong, and "A 5 Gb/s/s 0.25 μm CMOS jitter tolerant variable interval oversampling clock/data recovery circuits," in ISSCC Dig. Tech. Papers 2002, S. Lee, M. S. Hwang, Y. Choi, S. Kim, Y. Moon, B. J. Lee, D. K. Jeong, K. Kim, Y. J. Park and G. Ahn, analogous methods or circuits have been known which adjust the gain $K_{bpd}$ of the phase detector BPD for meeting bandwidth and signal/noise ratio requirements of the phase locked loop.

A disadvantage of these methods or circuits which have become known is generally that they require an increased outlay of analog circuits. An increased outlay of analog circuits means a higher consumption of chip area and energy and is thus cost-intensive. In addition, these known methods and circuits only have the aim of adjusting the gain $K_{bpd}$ of the phase detector. This leaves out of consideration an adaptation of gain $K_T$ of the oscillator device which can change over time due to disturbances.

BRIEF SUMMARY OF THE INVENTION

A method for stabilizing a transfer function of a digital phase locked loop, wherein the transfer function is dependent on a phase locked loop gain of the phase locked loop which changes with time due to disturbances, comprises the following steps:
feeding a random digital signal with a predetermined variance into the phase locked loop;

cross correlating a signal of the phase locked loop with the random signal fed in, for providing a cross correlation function;

estimating an impulse response between the random signal fed in and the signal of the phase locked loop by means of the cross correlation function provided and the predetermined variance of the random signal fed in; and setting the transfer function of the phase locked loop in dependence on the estimated impulse response.

A device for stabilizing a transfer function of a digital phase locked loop, wherein the transfer function is dependent on a phase locked loop gain of the phase locked loop which changes with time due to disturbances, comprises a stabilizing device which comprises:

means which feed a random digital signal with a predetermined variance into the phase locked loop, a correlation device which cross correlates a signal of the phase locked loop with the random signal fed in for providing a cross correlation function, means which estimate an impulse response between the random signal fed in and the signal of the phase locked loop by means of the cross correlation function provided and the predetermined variance of the random signal fed in, and means which set the transfer function of the phase locked loop in dependence on the estimated impulse response.

Advantageously, the transfer function of the digital phase locked loop may now be adjustable in dependence on the estimated impulse response according to the invention. This means that, by estimating the impulse response, a possibility is provided for adapting the transfer function in such a manner that the operating point of the phase locked loop remains within a permissible operating point range. The adapted and thus stabilized transfer function of the phase locked loop ensures that the digital phase locked loop can adhere to all predeterminable criteria such as bandwidth or signal/noise ratio over the entire operation. In particular, changes in the gain of the phase detector and the gain of the oscillator device are taken into consideration in the adjustment of the transfer function of the phase locked loop according to the invention.

According to one embodiment of the inventive method, the method further comprises the steps of:
(a) feeding the random digital signal with the predetermined variance into the phase locked loop;
(b) determining a digital phase difference signal between a feedback clock signal of the phase locked loop and a reference clock signal;
(c) cross correlating the phase difference signal determined with the random signal fed in, for providing the cross correlation function;
(d) estimating the impulse response between the random signal fed in and the phase difference signal by means of the cross correlation function provided and the predetermined variance of the random signal fed in; and
(e) setting the transfer function of the phase locked loop in dependence on the estimated impulse response.

The setting of the transfer function of the phase locked loop in dependence on the estimated impulse response may comprise the following method substeps:

calculating an estimated phase locked loop gain from the estimated impulse response, the damping factor and the variance of the random signal fed in;

providing a first gain factor of a first loop filter path of a loop filter of the phase locked loop and a second gain factor of a second loop filter path of the loop filter in dependence on the estimated phase locked loop gain calculated;

adjusting a first amplifying unit of the first loop filter path by means of the first gain factor provided and a second amplifying unit of the second loop filter path by means of the second gain factor provided, for stabilizing the transfer function.

The inventive device may further comprise:
(a) a phase detector which determines a digital phase difference signal between a feedback clock signal of the phase locked loop and a reference clock signal; and
(b) the stabilizing device which comprises:
(b1) means which feed the random digital signal with the predetermined variance into the phase locked loop,
(b2) a correlation device which cross correlates the phase difference signal determined with the random signal fed in, for providing the cross correlation function,
(b3) means which estimate the impulse response between the random signal fed in and the phase difference signal by means of the cross correlation function provided and the predetermined variance of the random signal fed in, and
(b4) means which set the transfer function of the phase locked loop in dependence on the estimated impulse response.

A damping unit may be provided which damps the random digital signal by means of an adjustable damping factor before it is fed into the phase locked loop.

A digital filter device may be provided which calculates the estimated impulse response by means of a quotient from the cross correlation function provided and the predetermined variance of the random signal fed in.

The digital filter device may calculate an estimated phase locked loop gain from the estimated impulse response, the damping factor and the variance of the random signal fed in.

A lookup table device may be provided which provides a first gain factor of a first loop filter path of a loop filter of the phase locked loop and a second gain factor of a second loop filter path of the loop filter in dependence on the calculated estimated phase locked loop gain. The lookup table device preferably has a RAM memory.

A first amplifying unit may be provided in the first loop filter path which is adjustable by means of the first gain factor provided, and a second amplifying unit may be provided in the second loop filter path which is adjustable by means of the second gain factor provided.

An addition device may be provided which adds the output signals of the loop filter paths of the loop filter to the random signal and feeds these to an oscillator circuit.

DETAILED DESCRIPTION OF THE INVENTION

In all figures, identical or functionally identical elements and signals have been provided with the same reference symbols unless otherwise specified.

Figure 3:
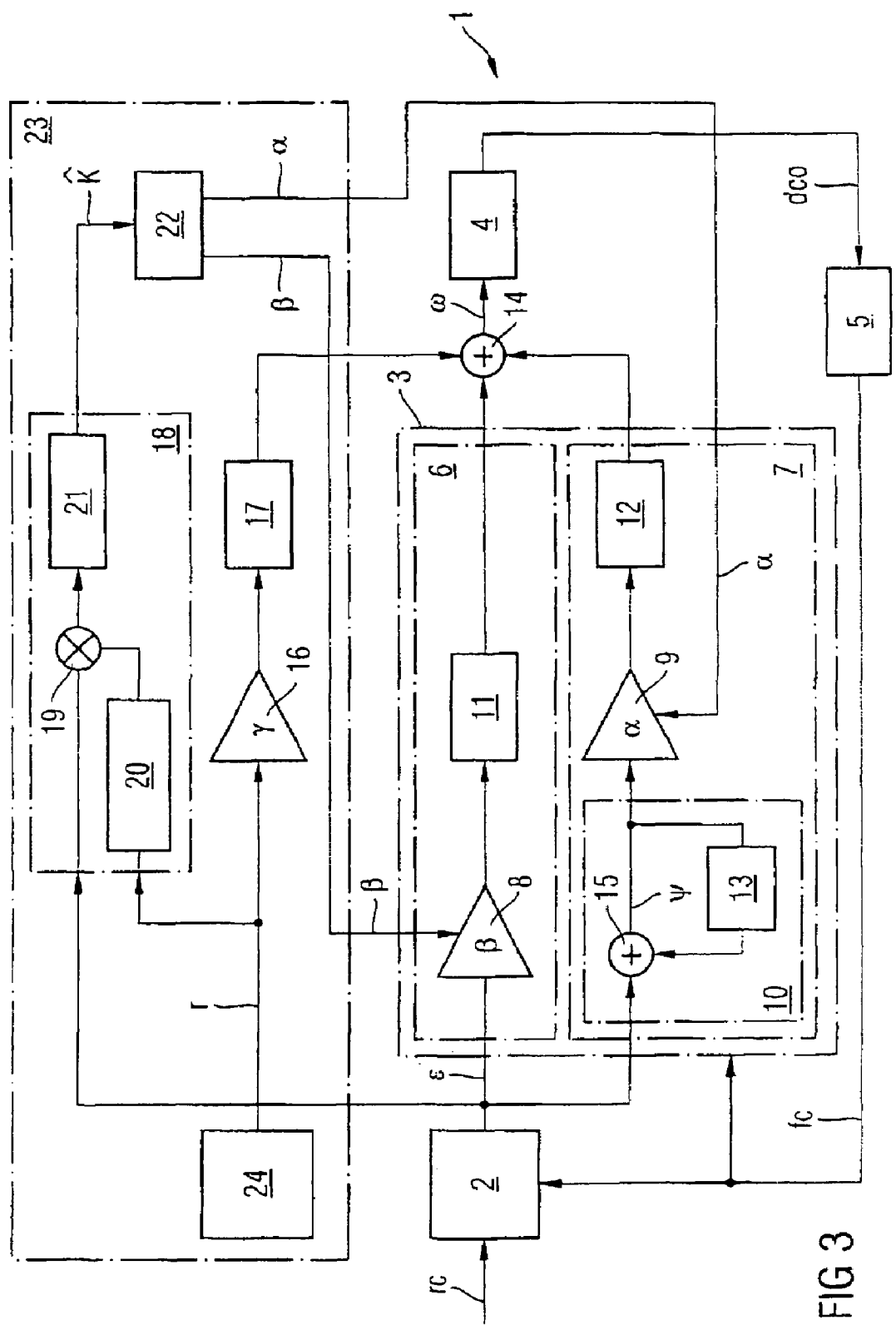
FIG. 3 is a schematic block diagram of an exemplary embodiment of the inventive device.

FIG. 3 shows a schematic block diagram of a preferred exemplary embodiment of the device according to the invention.

The device according to the invention contains a phase locked loop 1 which has a phase detector 2, a loop filter 3, a digitally controlled oscillator device 4 and a divider device 5.

The binary phase detector 2 determines a digital binary phase difference signal $\epsilon$ between a feedback clock signal fc and a reference clock signal rc. The binary phase detector 2 provides the digital phase difference signal $\epsilon$ at the input of the loop filter 3. The loop filter 3 generates in dependence on the digital phase difference signal $\epsilon$ provided, an oscillator control signal $\omega$ by means of which the digitally controlled oscillator device 4 can be controlled. To generate the oscillator control signal $\omega$, the loop filters 3 has a first loop filter path 6 and a second loop filter path 7. The first loop filter path 6 is constructed as a proportional path for the amplification of the digital phase difference signal $\epsilon$ provided. To provide higher gains, the second loop filter path 7 is constructed as an integral path.

The first loop filter path 6 has a first amplifying unit 8 and a first timing element 11. The first amplifying unit 8 receives at its input the digital phase difference signal $\epsilon$ and amplifies it by the gain factor $\beta$. The phase difference signal $\epsilon$ amplified by the gain factor $\beta$ is supplied to the first time element 11 which models latency time based on hardware and delays the amplified phase difference signal $\epsilon$.

The second loop filter path 7 has an integrator unit 10, a second amplifying unit 9 and a second timing element 12. The integrator unit 10 contains a first addition device 15 which adds the digital phase difference signal $\epsilon$ and an integrator phase difference signal $\psi$ fed back via a third timing element 13. The integrated phase difference signal $\psi$ is amplified by a gain factor $\alpha$ of the second loop filter path 7 by means of the second amplifying unit 9. The second timing element 12, like the first timing element 11, models latency times based on hardware and delays the integrated phase difference signal $\psi$.

In addition, the digital phase locked loop 1 has a second addition device 14 which adds the output signals of the first loop filter path 6 and of the second loop filter path 7 for forming the oscillator control signal $\omega$.

The oscillator device 4 can be controlled by means of the oscillator control signal $\omega$ and outputs a digital output clock signal dco in dependence on the received oscillator control signal $\omega$.

The digital phase locked loop 1 also has a feedback branch between the oscillator device 4 and the phase detector 2. In the feedback branch, a divider device 5 is provided which divides the output clock signal dco of the oscillator device 4 by means of a divider factor N and provides the feedback clock signal fc at its output. The feedback clock signal fc has an N-fold frequency of the output clock signal dco. The feedback clock signal fc can also be used for clocking the loop filter 3.

Figure 1:
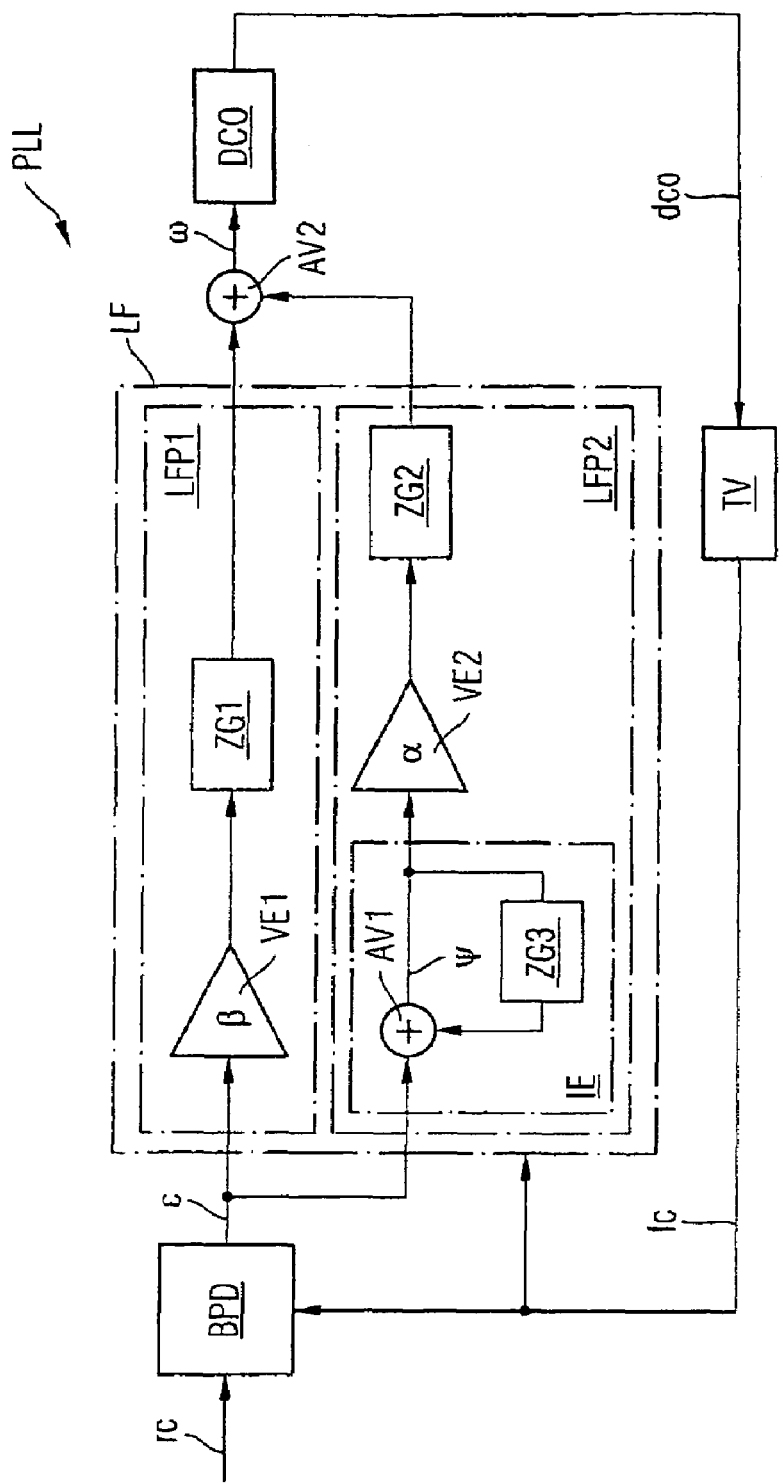
FIG. 1, as discussed above, is a schematic block diagram of a digital phase locked loop internally known to the applicant.

The phase locked loop 1 according to FIG. 3 differs from the phase locked loop according to FIG. 1 in that the first amplifying unit 8 and the second amplifying unit 9 can be adjusted with respect to their respective gain factors $\alpha, \beta$.

Figure 2:
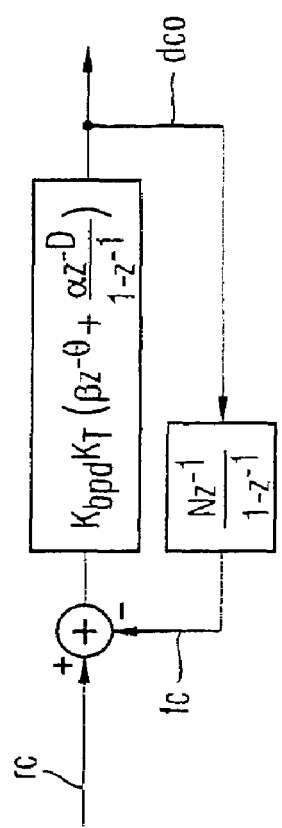
FIG. 2, as discussed above, is a diagrammatic representation of a linear model of the digital phase locked loop of FIG. 1.

With respect to FIG. 2, the phase locked loop gain K of the phase locked loop 1 is obtained from a product of the gain $K_{bpd}$ of the phase detector 2, of the gain $K_T$ of the oscillator device 3 and the divider factor N of the divider device 5:

$$K = K_{bpd} N K_T \qquad (2)$$

To illustrate the invention, the following consideration of system theory is useful.

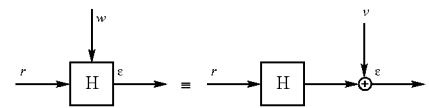

The above figure shows a system which has a discrete time signal r as input and the signal $\epsilon$ as output, the impulse response h of the system being unknown. Furthermore, a disturbance variable designated by w is assumed to exist. The signal $\epsilon$ can thus be expressed by the following equation:

$$\varepsilon_k = \sum_{n=0}^{+\infty} \hat{h}_n r(k-n) + v_k, \qquad (3)$$

where v is the distribution of the disturbance variable w at the output and $\hat{h}$ is an estimate of the impulse response h. Following this, the correlation function $R_{\epsilon r}$ between $\epsilon$ and r is calculated:

$$R_{\varepsilon r}(m) = \sum_{n=0}^{+\infty} \hat{h}_n R_r(m-n) + R_{vr}(m) \qquad (4)$$

Assuming, that the signal r is white Gaussian noise and v is orthogonal to r, the correlation function $R_r(m-n)$ is obtained as:

$$R_r(m-n) = \sigma_{m-n} * \sigma_r^2 \qquad (5)$$

and thus the estimated impulse response $\hat{h}_m$ as:

$$\hat{h}_m = \frac{R_{\varepsilon r}(m)}{\sigma_r^2} \qquad (6)$$

Equation (6) thus produces a formula for estimating the impulse response $\hat{h}_m$ from the correlation between the input and output signals of the system. It will be shown below that equation (6) is an estimator of the least error squares. In fact, the least error square Q is defined as (E[ ] is the expected-value operator):

$$Q := E\left[\left(\varepsilon_k - \sum_{n=0}^{+\infty} \hat{h}_n r_{k-n} v_k\right)^2\right] \qquad (7)$$

after algebraic transformations, the following is obtained:

$$Q = \sigma_\varepsilon^2 + E\left[\left(\sum_{n=0}^{-\infty} \hat{h}_n r_{k-n}\right)^2\right] + \sigma_v^2 - 2\sum_{n=0}^{+\infty} \hat{h}_n R_\sigma(n) - 2R_{\varepsilon v}(0) + 2\sum_{n=0}^{+\infty} \hat{h}_n R_{vr}(n), \quad (8)$$

where the last term can be set to zero with the assumption that v is orthogonal to r. The condition for minimizing the error Q can be written as:

$$\frac{\partial Q}{\partial h_m} = 0 \,\forall\, h_m, \quad (9)$$

differentiation resulting in the equation (10) below:

$$E\left[2\left(\sum_{n=0}^{+\infty} \hat{h}_n r_{k-n}\right) r_{k-m}\right] - 2R_\sigma(m) = 0 \quad (10)$$

equation (10) satisfies equation (6) and it is thus shown that the estimated impulse response $\hat{h}_m$ according to (6) is a least error squares estimator. The correlation function $R_{\varepsilon r}$ and the variance $\sigma_r^2$ can be estimated from a finite sequence of N samples, using the following equations:

$$\hat{R}_{\varepsilon r}(m) = \frac{1}{N}\sum_{n=1}^{N} \varepsilon_n r_{n-m} \quad (11)$$

and $$\hat{\sigma}_r^2 = \frac{1}{N}\sum_{n=1}^{N} r_n^2 \quad (12)$$

The device according to the invention according to FIG. 3 for stabilizing the transfer function of the digital phase locked loop 1 is characterized, in particular, by a stabilizing device 23. The stabilizing device 23 preferably has a random signal generator 24 which generates a random digital signal r with a predetermined variance $\sigma_r^2$. Furthermore, a damping unit 16 which damps the random digital signal r generated by means of an adjustable damping factor $\gamma$ is provided in the stabilizing device 23 according to the invention. The adjustable damping factor $\gamma$ is selected in such a manner that the random noise, caused by the random signal r, does not change the performance of the digital phase locked loop significantly.

The random digital signal r damped by the damping unit 16 is supplied to a fourth timing element 17 which models latency times of the chip and delays the damped random digital signal r. In the frequency domain, this latency time can be represented by $z^{-D\gamma}$. The damped and time-delayed random digital signal r is then supplied to a first addition device 14 which adds the output signals of the loop filter paths 6, 7 of the loop filter 3 to the random signal r and thus provides an oscillator control signal $\omega$ for the oscillator device 4.

Furthermore, the stabilizing device 23 has a correlation device 19 which cross correlates the phase difference signal $\varepsilon$ determined by the phase detector 2 with the random signal r generated for providing the cross correlation function $R_{\varepsilon r}$. The generated random digital signal r is preferably delayed by means of a fifth timing element 20 which models the latency times on the chip.

In addition, a digital filter device 2 is provided which estimates the impulse response $\hat{h}_m$ between the random signal r fed in and the phase difference signal $\varepsilon$ by means of the cross correlation function $R_{\varepsilon r}$ provided and the predetermined variance $\sigma_r^2$ of the random signal r fed in (compare equation 6). The digital filter device 21 preferably calculates the estimated impulse response $\hat{h}_m$ by means of a quotient from the cross correlation function $R_{\varepsilon r}$ provided and the predetermined variance $\sigma_r^2$ of the random signal r fed in. From the estimated impulse response $\hat{h}_m$, the damping factor $\gamma$ and the variance $\sigma_r^2$ of the random signal r fed in, the digital filter device 21 preferably calculates an estimated phase locked loop gain $\hat{K}$ for the phase locked loop gain K of the phase locked loop 1.

The stabilizing device 23 also preferably contains a lookup table device 22 which provides the first gain factor $\beta$ of the first loop filter path 6 of the loop filter 3 of the phase locked loop 1 and the second gain factor $\alpha$ of the second loop filter path 7 of the loop filter 3 in dependence on the calculated estimated phase locked loop gain $\hat{K}$. The first gain factor $\beta$ provided and the second gain factor $\alpha$ are used for adjusting the first amplifying unit 8 and the second amplifying unit 9, respectively, in such a manner that the change with time of the phase locked loop gain K is compensated for and thus the total transfer function of the phase locked loop 1 remains stable.

According to FIGS. 3 and 1, the transfer function between the random signal r and the phase difference signal $\varepsilon$ is obtained as follows:

$$H_{r,\varepsilon}(z) = \frac{-\gamma z^{-D_\gamma} z^{-1}(1-z^{-1})K}{((1-z^{-1})^2 + Kz^{-1}[\beta(1-z^{-1}) + \alpha z^{-D}])} \quad (13)$$

Assuming that the phase locked loop 1 is a causal system, the impulse response $h_{r,\varepsilon}(m)$ is zero for all points in time $m \leq D_\gamma$ and the first possible value not equal to zero obtained is:

$$h_{r,\varepsilon}(D_\gamma + 1) = \lim_{z \to \infty} z^{D_\gamma - 1} H_{r,\varepsilon}(z) = -\gamma K, \quad (14)$$

so that the phase locked loop gain K can be estimated by:

$$K = \frac{h_{r,\varepsilon}(D_\gamma + 1)}{\gamma}; \quad (15)$$

where the following is obtained, using equation (6) for the estimated phase locked loop gain $\hat{K}$:

$$\hat{K} = -\frac{1}{\gamma} \frac{\hat{R}_{\varepsilon,r}(D_\gamma + 1)}{\hat{\sigma}_r^2} \quad (16)$$

the first gain factor $\beta$ and the second gain factor $\alpha$ can then be provided preferably by means of the calculated estimated phase locked loop gain $\hat{K}$.

Figure 4:
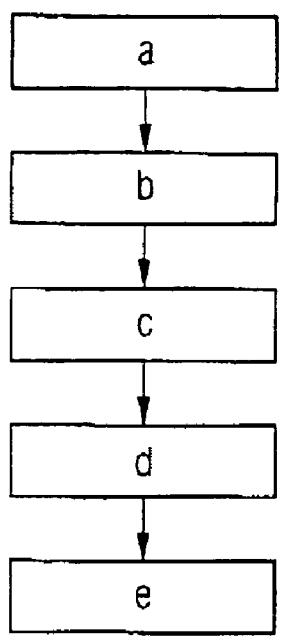
FIG. 4 is a diagrammatic flow chart of a first exemplary embodiment of the inventive method.

FIG. 4 shows a diagrammatic flowchart of a first preferred exemplary embodiment of the method according to the invention. The method according to the invention for stabilizing the transfer function of the digital phase locked loop, which depends on a phase locked loop gain K of the phase locked loop which changes due to disturbances, has the following method steps:

Method Step a:

A random digital signal r which is characterized by a predetermined variance $\sigma_r^2$ is fed into the phase locked loop 1. Before being fed into the phase locked loop 1, the random digital signal r is preferably damped by means of an adjustable damping factor $\gamma$.

Method Step b:

A digital phase difference signal $\epsilon$ is determined between a feedback clock signal fc of the phase locked loop 1 and a reference clock signal rc.

Method Step c:

The phase difference signal $\epsilon$ determined is cross correlated with the random signal r fed in for providing a cross correlation function $R_{\epsilon r}$.

Method Step d:

An impulse response $\hat{h}_m$ between the random signal r fed in and the phase difference signal $\epsilon$ is estimated by means of the cross correlation function $R_{\epsilon r}$ provided and the predetermined variance $\sigma_r^2$ of the random signal fed in. The estimated impulse response is preferably calculated by means of a quotient from the cross correlation function $R_{\epsilon r}$ provided and the predetermined variance $\sigma_r^2$ of the random signal r fed in.

Method Step e:

The transfer function of the phase locked loop 1 is set in dependence on the estimated impulse response $\hat{h}_m$ for stabilization.

Figure 5:
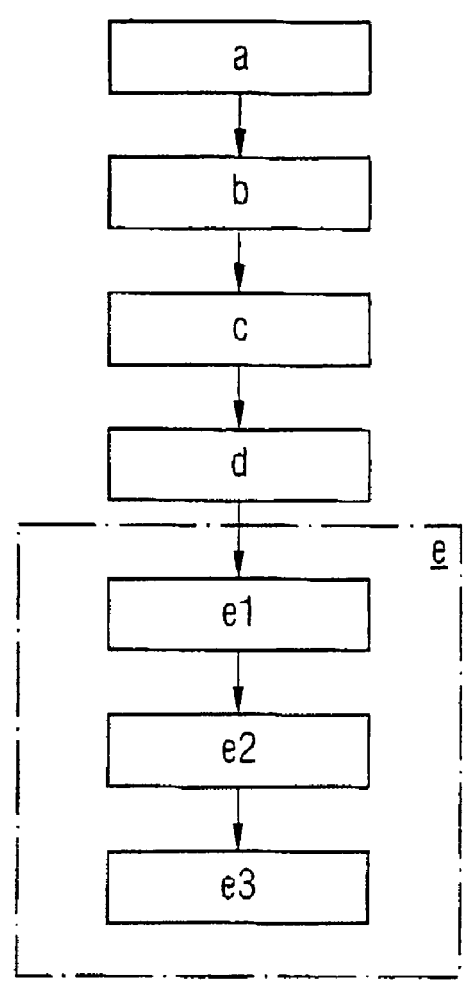
FIG. 5 is a diagrammatic flow chart of a second exemplary embodiment of the inventive method.

FIG. 5 shows a diagrammatic flowchart of a second preferred exemplary embodiment of the method according to the invention. The method according to the invention according to FIG. 5 differs from the method according to FIG. 4 only in a specification of method step e. Method step e according to FIG. 4 is provided by the following method steps e1-e3 according to FIG. 5.

Method Step e1:

An estimated phase locked loop gain $\hat{K}$ is calculated from the estimated impulse response $\hat{h}_m$ of the damping factor $\gamma$ and the variance $\sigma_r^2$ of the random signal r fed in.

Method Step e2:

A first gain factor $\beta$ of a first loop filter path 6 of a loop filter 3 of the phase locked loop 1 and a second gain factor $\alpha$ of a second loop filter path 7 of the loop filter 3 are provided in dependence on the calculated estimated phase locked loop gain $\hat{K}$.

Method Step e3:

The first amplifying unit 8 of the first loop filter path 6 is set by means of the first gain factor $\beta$ provided. The second amplifying unit 9 of the second loop filter path 7 is set by means of the second gain factor $\alpha$ provided. Setting the gain factors $\alpha$ and $\beta$ is used for stabilizing the transfer function so that the operating point of the phase locked loop 1 remains within permissible operating point range.

Figure 6:
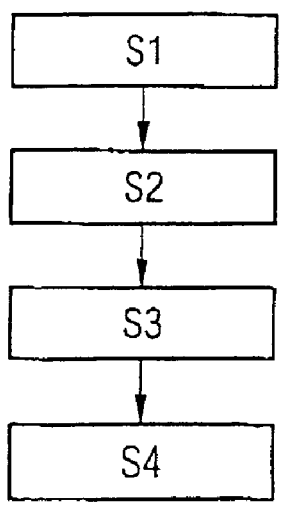
FIG. 6 is a diagrammatic flow chart of a third exemplary embodiment of the inventive method.

FIG. 6 shows a diagrammatic flowchart of a third preferred exemplary embodiment of the method according to the invention. The method according to the invention for stabilizing the transfer function of the digital phase locked loop, which depends on a phase locked loop gain K of the phase locked loop which changes with time due to disturbances, has the following method steps:

Method Step S1:

Feeding a random digital signal r with a predetermined variance $\sigma_r^2$ into the phase locked loop 1.

Method Step S2:

Cross correlating a signal $\omega$,dco,fc,$\epsilon$ of the phase locked loop 1 with the random signal r fed in for providing a cross correlation function $R_{\epsilon r}$.

Method Step S3:

Estimating an impulse response $\hat{h}_m$ between the random signal r fed in and the signal $\omega$,dco,fc,$\epsilon$ of the phase locked loop 1 by means of the cross correlation function $R_{\epsilon r}$ provided and the predetermined variance $\sigma_r^2$ of the random signal r fed in.

Method Step S4:

Setting the transfer function of the phase locked loop 1 in dependence on the estimated impulse response $\hat{h}_m$.

Although the present invention has been described above by means of the preferred exemplary embodiments, it is not restricted to these but can be modified in many ways. For example, the present invention can be applied not only for the phase locked loop described in the figure but to any phase locked loop.

What is claimed is:

1. A method for stabilizing a transfer function of a digital phase locked loop, comprising the steps of:

feeding a random digital signal into a phase locked loop which comprises a transfer function and a phase locked loop gain; said transfer function being dependent from said phase locked loop gain which changes with time due to disturbances and said random digital signal comprising a predetermined variance;

generating a cross correlation function by cross correlating a signal of said phase locked loop with said random digital signal;

estimating an impulse response between said random digital signal and said signal of said phase locked loop by means of said cross correlation function and said predetermined variance of said random signal; and setting said transfer function of said phase locked loop in dependence on said estimated impulse response.

2. The method of claim 1, further comprising the steps of:

determining a digital phase difference signal between a feedback clock signal of said phase locked loop and a reference clock signal;

generating said cross correlation function by cross correlating said phase difference signal with said random digital signal; and estimating said impulse response between said random digital signal and said phase difference signal by means of said cross correlation function and the predetermined variance of said random signal.

3. The method of claim 2, comprising damping said random digital signal by means of an adjustable damping factor before feeding it into said phase locked loop.

4. The method of claim 2, wherein said impulse response is calculated by means of a quotient from said cross correlation function and said predetermined variance of said random digital signal.

5. The method of claim 3, wherein said impulse response is calculated by means of a quotient from said cross correlation function and said predetermined variance of said random digital signal.

6. The method of claim 3, wherein said setting of said transfer function of said phase locked loop in dependence on said estimated impulse response comprises the steps of:
- calculating an estimated phase locked loop gain from said estimated impulse response, said damping factor and said variance of said random digital signal;
- generating a first gain factor of a first loop filter path of a loop filter of said phase locked loop and a second gain factor of a second loop filter path of said loop filter in dependence on said estimated phase locked loop gain; and
- for stabilizing said transfer function, adjusting a first amplifying unit of said first loop filter path by means of said first gain factor and a second amplifying unit of said second loop filter path by means of said second gain factor.

7. A stabilizing device, comprising:
- a feeding device for feeding a random digital signal into a digital phase locked loop, which comprises a phase locked loop gain and a transfer function being dependent on said phase locked loop gain which changes with time due to disturbances; said transfer function being dependent from said phase locked loop gain and said random digital signal comprising a predetermined variance;
- a correlation device for generating a cross correlation function by cross correlating a signal of said phase locked loop with said random signal;
- an estimating device for estimating an impulse response between said random digital signal and said signal of said phase locked loop by means of said cross correlation function and said predetermined variance of said random digital signal; and
- a setting device for setting said transfer function in dependence on said estimated impulse response.

8. The stabilizing device of claim 7, comprising a damping unit for damping said random digital signal by means of an adjustable damping factor before feeding it into said phase locked loop.

9. A device for stabilizing a transfer function of a digital phase locked loop comprising a transfer function and a phase locked loop gain which changes with time due to disturbances; said transfer function being dependent from said phase locked loop gain and said random digital signal comprising a predetermined variance and said device for stabilizing said transfer function comprising:
- a phase detector for determining a digital phase difference signal between a feedback clock signal of said phase locked loop and a reference clock signal; and
- a stabilizing device which comprises:
  - a feeding device for feeding said random digital signal into said phase locked loop;
  - a correlation device for generating a cross correlation function by cross correlating said phase difference signal with said random digital signal;
  - an estimating device for estimating an impulse response between said random digital signal and said phase difference signal by means of said cross correlation function and said predetermined variance of said random digital signal; and
  - a setting device for setting said transfer function of said phase locked loop in dependence on said estimated impulse response.

10. The device for stabilizing a transfer function of claim 9, wherein said stabilizing device comprises a damping unit for damping said random digital signal by means of an adjustable damping factor before feeding it into said phase locked loop.

11. The device for stabilizing a transfer function of claim 9, comprising a digital filter for calculating said estimated impulse response by means of a quotient from said cross correlation function and said predetermined variance of said random signal.

12. The device for stabilizing a transfer function of claim 11, wherein said digital filter calculates an estimated phase locked loop gain from said estimated impulse response, said damping factor and said variance of said random signal.

13. The device for stabilizing a transfer function of claim 12, comprising a lookup table device for providing a first gain factor of a first loop filter path of a loop filter of said phase locked loop and a second gain factor of a second loop filter path of said loop filter in dependence on said estimated phase locked loop gain.

14. The device for stabilizing a transfer function of claim 13, comprising a first amplifying unit, which can be adjusted by means of said first gain factor, in said first loop filter path, and a second amplifying unit, which can be adjusted by means of said second gain factor, in said second loop filter path.

15. The device for stabilizing a transfer function of claim 14, comprising an addition device for adding output signals of said first and second loop filter paths of said loop filter to said random digital signal and for supplying supplies these to an oscillator device.

* * * * *